(12) United States Patent
Michel et al.

(10) Patent No.: US 12,732,172 B2
(45) Date of Patent: Sep. 8, 2026

(54) ELECTRIC FILTERING CIRCUITRY FOR FILTERING RIPPLES OF AN INPUT SIGNAL

(71) Applicant: ams International AG, Jona (CH)

(72) Inventors: Fridolin Michel, Au (CH); Charalambos Andreou, Tann (CH)

(73) Assignee: ams International AG, Jona (CH)

( * ) Notice: Subject to any disclaimer, the term of this patent is extended or adjusted under 35 U.S.C. 154(b) by 0 days.

(21) Appl. No.: 18/854,245

(22) PCT Filed: Mar. 14, 2023

(86) PCT No.: PCT/EP2023/056448

§ 371 (c)(1),
(2) Date: Oct. 4, 2024

(87) PCT Pub. No.: WO2023/194050

PCT Pub. Date: Oct. 12, 2023

(65) Prior Publication Data

US 2025/0253836 A1 Aug. 7, 2025

(30) Foreign Application Priority Data

Apr. 5, 2022 (DE) ..................... 10 2022 108 139.7

(51) Int. Cl.
*H03K 5/00* (2006.01)
*H03K 5/1252* (2006.01)

(52) U.S. Cl.
CPC .................................. *H03K 5/1252* (2013.01)

(58) Field of Classification Search
CPC .. H03K 5/1252; H03H 7/0107; H03H 7/0153; H03H 11/00; H03H 11/0405; H03H 2210/00
See application file for complete search history.

(56) References Cited

U.S. PATENT DOCUMENTS

| | | | |
|---|---|---|---|
| 4,481,597 | A | 11/1984 | Robbins |
| 5,194,802 | A | 3/1993 | Hill et al. |

(Continued)

FOREIGN PATENT DOCUMENTS

| | | | |
|---|---|---|---|
| CN | 102223498 | A | 10/2011 |
| CN | 103023502 | A | 4/2013 |

(Continued)

OTHER PUBLICATIONS

International Search Report issued for corresponding International Patent Application No. PCT/EP2023/056448 on Aug. 29, 2023 (5 pages).

(Continued)

*Primary Examiner* — Tuan T Lam
(74) *Attorney, Agent, or Firm* — HAUPTMAN HAM, LLP

(57) ABSTRACT

An electric filtering circuitry for filtering ripples of an input signal, includes an input terminal for applying the input signal, an output terminal to provide an output signal, and a forward path including a clocked integrator circuit and a clocked sample-and-hold or track-and-hold circuit. The electric filtering circuitry also includes a summing node that receives the input signal and the output signal, and provides a difference signal. The clocked integrator circuit has an input side connected to the summing node to receive the difference signal, and an output side to provide an integrator output signal. The clocked sample-and-hold or track-and-hold circuit has an input side to receive the integrator output signal, and an output side to provide a sample-and-hold or track-and-hold output signal. The output side of the sample-and-hold or track-and-hold circuit is coupled to the output terminal. A feedback path is between the output terminal and the summing node.

15 Claims, 6 Drawing Sheets

(56) References Cited

U.S. PATENT DOCUMENTS

| | | | | |
|---|---|---|---|---|
| 5,604,309 | A | 2/1997 | Ward | |
| 5,777,871 | A * | 7/1998 | Wise | G05B 13/045 700/29 |
| 7,764,118 | B2 | 7/2010 | Kusuda et al. | |
| 8,120,422 | B1 | 2/2012 | Huijsing et al. | |
| 10,003,306 | B1 | 6/2018 | Larson et al. | |
| 10,326,354 | B2 | 6/2019 | Beck | |
| 10,483,920 | B2 | 11/2019 | Larson et al. | |
| 2007/0103838 | A1 | 5/2007 | Kimura | |
| 2014/0266827 | A1 * | 9/2014 | Ceballos | H03M 3/418 341/143 |
| 2016/0043758 | A1 * | 2/2016 | Pagnanelli | H03M 3/344 375/349 |
| 2019/0068146 | A1 | 2/2019 | Raman et al. | |
| 2019/0260356 | A1 * | 8/2019 | Hossain | H04B 1/109 |
| 2019/0363727 | A1 * | 11/2019 | Derks | H03M 3/454 |

FOREIGN PATENT DOCUMENTS

| | | | |
|---|---|---|---|
| CN | 112181038 | A | 1/2021 |
| DE | 32 37 160 | A1 | 4/1983 |
| DE | 691 20 637 | T2 | 1/1997 |
| EP | 0 798 865 | A2 | 10/1997 |
| JP | S57-15515 | A | 1/1982 |
| JP | S57-15516 | A | 1/1982 |

OTHER PUBLICATIONS

Written Opinion issued for corresponding International Patent Application No. PCT/EP2023/056448 on Aug. 29, 2023 (10 pages).

* cited by examiner 70
71
DAC
$V_{estimate}$
104
0100
$V_{out}$
72
SAR
Controller
SAR_mode
40
pd
AOS
50
73
$V_{in}^{+}$
$V_{in}^{-}$
latch
20
$clk_{int}$
clk
SHOS
102
IOS
10
$clk_{int}$
reset clk
30
DS
101
$V_{in}$
I100

ELECTRIC FILTERING CIRCUITRY FOR FILTERING RIPPLES OF AN INPUT SIGNAL

CROSS REFERENCE TO RELATED APPLICATION

This application is a National Stage of International Application No. PCT/EP2023/056448, filed on Mar. 14, 2023, which designates the United States and was published in Europe, and which claims priority to German Patent Application No. 10 2022 108 139.7, filed on Apr. 5, 2022, in the German Patent Office. Both of the aforementioned applications are hereby incorporated by reference in their entireties.

TECHNICAL FIELD

The disclosure relates to an electric filtering circuitry for filtering ripples of an input signal, particularly ripples caused by chopping or dynamic element matching operations. The disclosure further relates to a voltage generation circuitry, for example a reference voltage generation circuitry, to provide a ripple-free output signal.

BACKGROUND

CMOS circuits typically suffer from large random mismatch that produces significant offset inhibiting precision circuit operations and sensing. Therefore, it is common practice to distribute these mismatch contributions in the time domain by modulation to a frequency beyond DC, so that random error contributions cancel on average. In the field of precision analog circuit design, methods based on chopping or dynamic element matching operations are effective to address this issue.

However, the modulated random errors occur as ripple around the "true" DC voltage. Ripple removal therefore requires a filter with cutoff frequency proportional to the modulation frequency. For on-chip integration a filter with a high cutoff frequency is required in order to obtain small filter capacitances and resistors. However, this can only be achieved with a high modulation frequency which yields residue errors due to clock feedthrough, charge injection and settling errors. As a result, a low modulation frequency using off-chip components is typically required in high accuracy applications.

There is a need to provide an electric filtering circuitry for filtering ripples of an input signal having a filter topology with low area footprint and fast startup while being compatible with very low modulation frequencies for maximum accuracy.

SUMMARY

An electric filtering circuitry that consumes low area and provides a fast start up for filtering ripples of an input signal, wherein ripple filtering can be performed without degrading DC accuracy, is specified in claim 1.

The electric filtering circuitry for filtering ripples of an input signal comprises an input terminal for applying the input signal, an output terminal to provide an output signal, and a forward path including a clocked integrator circuit and a clocked sample-and-hold or track-and-hold circuit. The electric filtering circuitry further comprises a summing node being arranged to receive the input signal and the output signal, and to provide a difference signal being a representation of a difference between the input signal and the output signal.

The clocked integrator circuit has an input side connected to the summing node to receive the difference signal, and an output side to provide an integrator output signal. The clocked sample-and-hold circuit or track-and-hold circuit has an input side to receive the integrator output signal, and an output side to provide a sample-and-hold output signal or track-and-hold output signal. The output side of the sample-and-hold or track-and-hold circuit is coupled (directly or indirectly which means that other blocks like, e.g. an attenuator, can be cascaded) to the output terminal. The electric circuitry further comprises a feedback path being arranged between the output terminal and the summing node.

The proposed approach of an electric filtering circuitry allows filtering of low frequency ripple that may be caused, for example by chopping or dynamic element matching operations, without relying on external components while guaranteeing fast startup. The filtering circuitry removes ripple transparency from the input terminal to the output terminal, wherein sensitivity to a sampling phase in an arbitrary ripple waveform is eliminated by a closed loop topology.

According to an embodiment of the electric filtering circuitry, the clocked integrator circuit is configured to sample and integrate the difference signal so that samples of the difference signal are integrated. The integrator output signal is provided as a representation of the integrated samples of the difference signal. The clocked sample-and-hold or track-and-hold circuit is configured to sample the integrator output signal, and to provide the sample-and-hold or track-and-hold output signal as a representation of the sampled integrator output signal.

The integrator circuit gives a lot of gain so that the loop can adjust for the error caused by sampling the waveform of the input signal. The sample-and-hold or track-and-hold circuit makes sure that the ripple is not transparent at the output.

According to a possible embodiment of the electric filtering circuitry, the clocked sample-and-hold or track-and-hold circuit is configured to sample or track the integrator output signal with a frequency being lower than a frequency at which the clocked integrator circuit samples and integrates the difference signal. The sample-and-hold or track-and-hold circuit thus performs down sampling/tracking which allows a single sample/track of the integrator output to be obtained for each cycle of the input signal.

According to a possible embodiment, the electric filtering circuitry comprises an attenuator circuit having an input side to receive the sample-and-hold or track-and-hold output signal, and an output side to provide an attenuator output signal. The output side of the attenuator circuit is coupled to the output terminal. The attenuator circuit is configured to attenuate a droop of a level of the sample-and-hold or track-and-hold output signal. The attenuator circuit allows to attenuate any droop and related ripple at the output of the sample-and-hold or track-and-hold circuit which may be caused by discharge of a hold capacitor of the sample-and-hold or track-and-hold circuit.

According to a possible embodiment, the electric filtering circuitry comprises a second summing node being arranged in the forward path to receive the sample-and-hold or track-and-hold output signal and an estimation signal representing an estimation of the input signal. The second summing node is further arranged to provide the output signal being a representation of a sum of the sample-andhold or track-and-hold output signal and the estimation signal. This configuration allows saturation of the integrator output for large DC signals to be prevented.

The estimation signal and the sample-and-hold or track-and-hold output signal may be added by the second summing node in the voltage or current domain. According to a possible embodiment of the electric filtering circuitry allowing current domain addition, the attenuator circuit may comprise a transconductor circuit being arranged between the output side of the sample-and-hold or track-and-hold circuit and the second summing node. Furthermore, the electric filtering circuitry may comprise at least one resistor that is arranged in a resistive current path between the second summing node and a reference potential. This embodiment enables an efficient implementation for current domain addition.

According to a possible embodiment of the electric filtering circuitry, the at least one resistor may comprise a plurality of resistors which are arranged in series in the resistive current path between the second summing node and the reference potential. The feedback path of the electric filtering circuitry is coupled to a tap of the resistive path between the resistors of the resistive current path.

The feedback path is thus coupled to a node between two of the resistors of the resistive path, and to the summing node for providing the difference between the input signal and the output signal. This embodiment in the current domain implementation allows the implementation of ratiometric output taps which are defined by the resistors between which the feedback path is coupled to the resistive path. A respective output terminal may be arranged between each of the resistors of the resistive path to generate a plurality of output signals/output voltages from a single input signal/input voltage.

According to a possible embodiment of the electric filtering circuitry for filtering ripples of an input signal, the filtering circuitry may comprise an estimation signal generation circuit which is configured to provide the estimation signal by successive approximation register assisted output range adjustment. This configuration of an estimation signal generation circuit that generates the estimation signal by successive approximation register assisted output range adjustment allows any PVT variation of the estimate signal to be minimized.

According to a possible embodiment of the electric filtering circuitry for filtering ripples of an input signal, the estimation signal generation circuit comprises a digital-to-analog converter, a successive approximation register control circuit and a latch circuit. The digital-to-analog converter, the successive approximation register control circuit and the latch circuit are arranged in a second feedback path between the output side of the clocked integrator circuit and the second summing node. This configuration allows the estimation signal to resemble the input signal as closely as possible. In conclusion, optimum attenuation can be achieved over a wide range of process and temperature variations.

The electric filtering circuitry for filtering ripples of an input signal according to any of the embodiments described above may be used in a voltage generation circuitry, for example a reference generation circuitry, to provide a ripple-free copy of an input signal/input voltage, for example a bandgap reference voltage, at the output. Such a voltage generation circuitry is specified in claim 11.

According to a possible embodiment of the voltage generation circuitry, the voltage generation circuitry comprises the electric filtering circuitry for filtering ripples of an input signal according to any of the embodiments described above, and a voltage generating circuit, for example a bandgap reference circuit, to provide the input signal for the electric filtering circuitry. The voltage generating circuit is embodied to provide the input signal with periodically repeating signal cycles. The input signal has a DC component being superimposed with an AC component. The AC component forms the ripple of the input signal.

According to a possible embodiment of the voltage generation circuitry, the voltage generating circuit is configured to provide each signal cycle of the input signal with a plurality of pulses clocked with a clock frequency of a clock signal of the voltage generating circuit. Each pulse forms the AC component of the input signal. That means that each pulse is above or below an average value of the input signal. The clocked integrator circuit of the electric filtering circuitry is configured to sample and integrate the difference signal with a clock frequency of an integrator clock signal that is applied to the clocked integrator circuit. The integrator clock signal has the same clock frequency as the clock signal of the voltage generating circuit. This configuration enables the ripple waveform superimposed on the input signal to be sampled and integrated by the clocked integrator circuit for each individual clock phase of the clock signal of the voltage generating circuit.

According to a possible embodiment of the voltage generation circuitry, the voltage generating circuit may comprise a circuit for providing chopping or dynamic element matching operations. The chopping or dynamic element matching operations may be controlled by the clock signal of the voltage generating circuit.

According to an embodiment of the voltage generation circuitry, a phase of the integrator clock signal is aligned with some delay referred to the clock signal of the voltage generating circuit. This embodiment enables that switching transients, which may be caused from dynamic element matching operations of the voltage generating circuit, can be masked by aligning the phase of the integrator clock signal with some delay referred to the clock signal of the voltage generating circuit that controls dynamic element matching operations in the voltage generating circuit.

According to a possible embodiment of the voltage generation circuitry, the clocked sample-and-hold or track-and-hold circuit is configured to sample the integrator output signal with a clock frequency of a sample-and-hold or track-and-hold clock signal that is applied to the clocked sample-and-hold or track-and-hold circuit such that the integrator output signal is sampled or tracked at most once per signal cycle of the input signal. This configuration enables the clocked sample-and-hold or track-and-hold circuit to provide, at its output side, a single sample or track of the integrator output for each integer multiple of a full period/cycle of the input signal, and thus reflect the true DC component of the input signal.

The proposed approach of the electric filtering circuitry allows to realize a highly effective and precise filter by integrating over a full period of the input signal ripple by the clocked integrator circuit, and with subsequent down sampling by the clocked sample-and-hold or track-and-hold circuit to eliminate ripple transparency to the output terminal. In order to maintain high DC accuracy the topology is based on a closed loop with optional sample-and-hold or track-and-hold attenuation for droop suppression.

Additional features and advantages of the electric filtering circuitry and the voltage generation circuitry are set forth in the detailed description that follows. It is to be understood that both the foregoing general description and the following detailed description are merely exemplary, and are intended to provide an overview or framework for understanding the nature and character of the claims.

BRIEF DESCRIPTION OF THE DRAWINGS

The accompanying drawings are included to provide further understanding, and are incorporated in, and constitute a part of, the specification. As such, the disclosure will be more fully understood from the following detailed description, taken in conjunction with the accompanying figures in which.

DETAILED DESCRIPTION OF THE EMBODIMENTS

Figure 1:
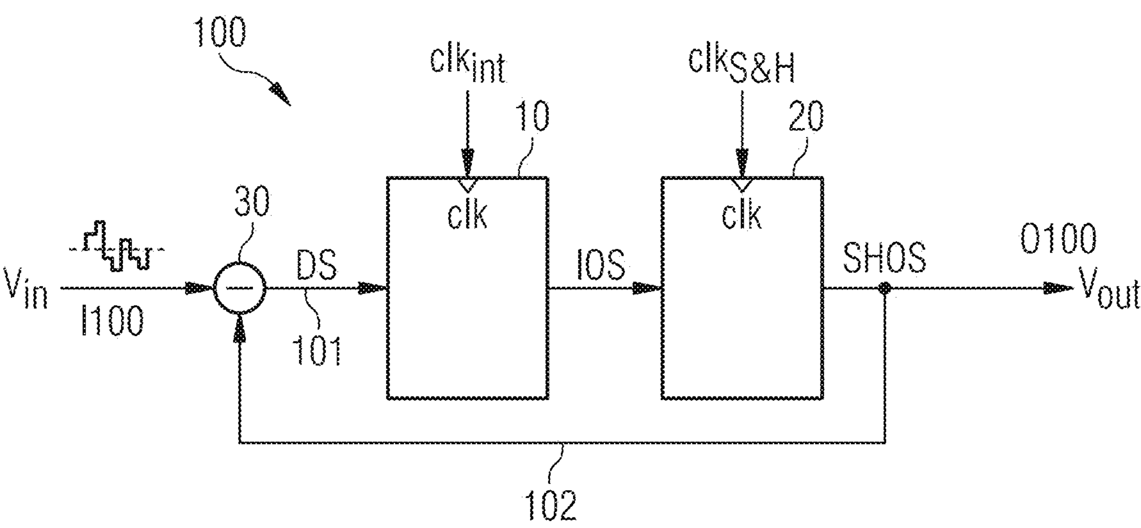
FIG. 1 illustrates a first embodiment of an electric filtering circuitry for filtering ripples of an input signal using a closed loop ripple filter topology.

Referring to FIG. 1, a first embodiment of an electric filtering circuitry 100 for filtering ripples of an input signal $V_{in}$ is shown. The electric filtering circuitry 100 comprises an input terminal I100 for applying the input signal $V_{in}$, and an output terminal O100 to provide an output signal $V_{out}$. The electric filtering circuitry 100 further comprises a forward path 101 which includes a clocked integrator circuit 10 and a clocked sample-and-hold circuit or track-and-hold circuit 20. The electric filtering circuitry 100 further comprises a summing node 30 being arranged to receive the input signal $V_{in}$ and the output signal $V_{out}$. Furthermore, the summing node 30 provides a difference signal DS being a representation of a difference between the input signal $V_{in}$ and the output signal $V_{out}$.

The clocked integrator circuit 10 has an input side being connected to the summing node 30 to receive the difference signal DS. The clocked integrator circuit 10 has an output side to provide an integrator output signal IOS. The clocked sample-and-hold circuit or track-and-hold circuit 20 has an input side to receive the integrator output signal IOS, and an output side to provide a sample-and-hold output signal or track-and-hold circuit SHOS. The output side of the sample-and-hold circuit or track-and-hold circuit 20 is coupled to the output terminal O100. A feedback path 102 is arranged between the output terminal O100 and the summing node 30.

Referring to FIG. 1, the clocked integrator circuit 10 of the electric filtering circuitry 100 is configured to sample and integrate the difference signal DS. As a result, samples of the difference signal DS are integrated by the integrator circuit 10. The integrator circuit 10 provides the integrator output signal IOS as a representation of the integrated samples of the difference signal DS. The subsequent clocked sample-and-hold circuit or track-and-hold circuit 20 is configured to sample the integrator output signal IOS. The clocked sample-and-hold circuit or track-and-hold circuit 20 then provides the sample-and-hold output signal or track-and-hold output signal SHOS as a representation of the sampled integrator output signal IOS.

The input signal $V_{in}$ may be provided by a voltage generating circuit that is coupled to the input terminal I100 of the electric filtering circuitry 100. FIG. 2 shows a configuration, where a voltage generating circuit 200 is coupled to the input terminal I100 of the electric filtering circuitry 100 for providing the input signal $V_{in}$ to the filtering circuitry 100. The voltage generating circuit 200 may be embodied to provide the input signal $V_{in}$ with periodically repeating signal cycles, as illustrated in FIG. 2B. The input signal $V_{in}$ has a DC component superimposed with an AC component. The AC component forms the ripple of the input signal $V_{in}$. As shown in FIG. 2B, each signal cycle of the input signal $V_{in}$ comprises a sequence of pulses around the mid-value of the input signal $V_{in}$.

The voltage generating circuit 200 may comprise a circuit 210 for providing chopping or dynamic element matching operations. The chopping or dynamic element matching operations may be controlled by a clock signal $clk_{DEM}$ of the voltage generating circuit 200.

The operation of the electric filtering circuitry 100 is explained in the following with reference to FIGS. 2A and 2B, assuming that the input signal $V_{in}$ is provided to the input terminal I100 of the electric filtering circuitry 100 by voltage generating circuit 200 using DEM (Dynamic Element Matching) operations. The generation of the input signal $V_{in}$ is, however, not limited to DEM operations, rather the waveform of the input signal $V_{in}$ shown in FIG. 2B can also be generated by any other appropriate techniques, such as by chopping operations.

Figure 2A:
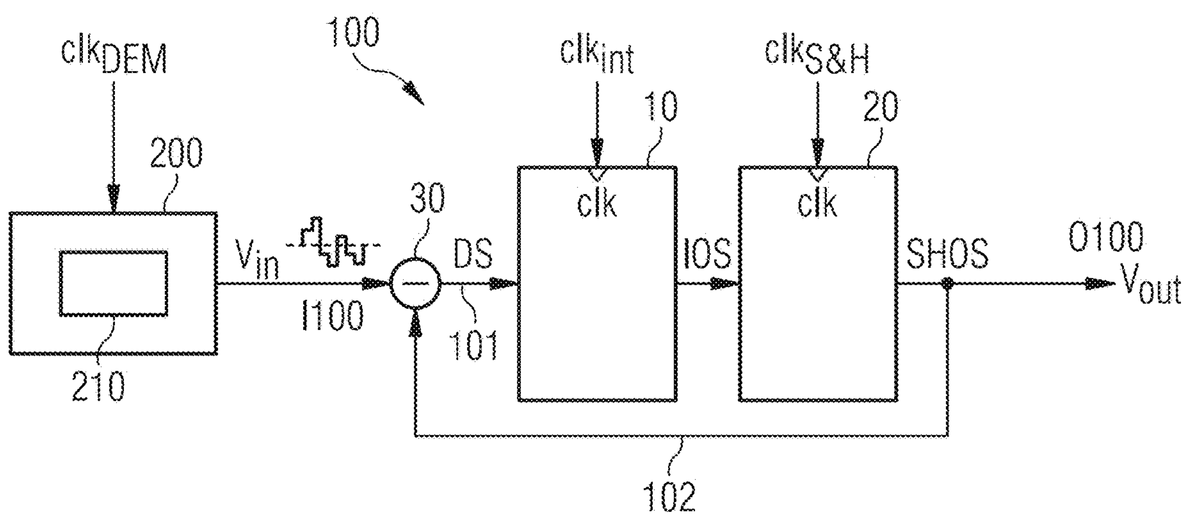
FIG. 2A shows an embodiment of an electric filtering circuitry for filtering ripples of an input signal provided by a voltage generating circuit.
Figure 2B:
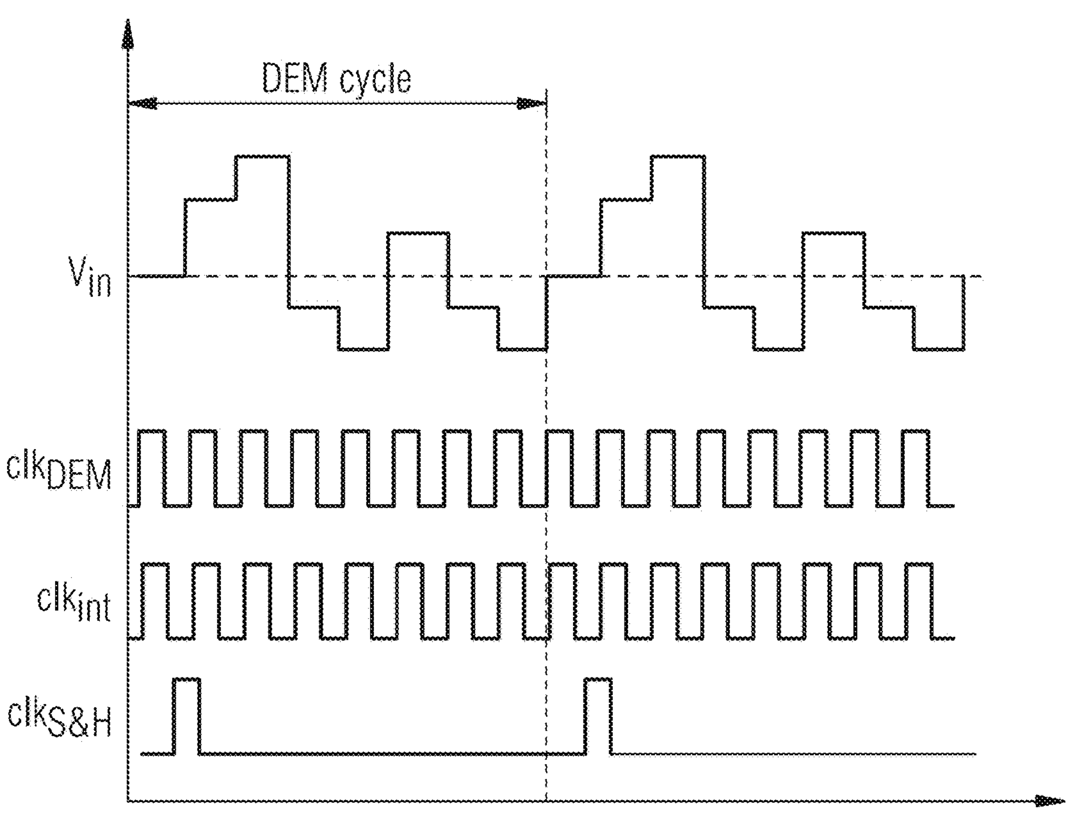
FIG. 2B shows curves of an input signal of the electric filtering circuitry and clock signals for understanding the operation of the electric filtering circuitry.

Referring to FIGS. 2A and 2B, the voltage generating circuit 200 is configured to provide each signal cycle of the input signal $V_{in}$ with a plurality of pulses clocked with a clock frequency of the clock signal $clk_{DEM}$ of the voltage generating circuit 200. Each pulse forms the AC component of the input signal $V_{in}$ and is above or below an average/mid-value of the input signal $V_{in}$, as illustrated in FIG. 2B. The clocked integrator circuit 10 is configured to sample and integrate the difference signal DS with the clock frequency of an integrator clock signal $clk_{int}$ applied to the clocked integrator circuit 10. The integrator clock signal $clk_{int}$ may have the same clock frequency as the clock signal $clk_{DEM}$ of the voltage generating circuit 200, as shown in FIG. 2B.

The ripples, caused for example by a DEM waveform, superimposed on a mid-value of the input signal $V_{in}$ are thus sampled and integrated by clocked integrator circuit 10 for each individual clock phase of the clock signal $clk_{DEM}$ of the voltage generating circuit 200. As in dynamic element matching random errors are distributed with both polarities over time, adding up all contributions of all clock phases, for example all DEM phases, during a full signal cycle of the input signal $V_{in}$, for example a full DEM cycle, results in a net error of zero, leaving only the DC signal component itself at the integrator output side. If the input signal ripple is already prefiltered, the ripple, for example a DEM ripple, will not appear as zero order hold steps and a continuous time integration must be employed to capture the true average.

However, discrete time integration has the advantage that switching transients from the DEM operations can be masked by aligning the phase of the integrator clock signal with some delay referred to the DEM clock. Thus, according to a possible embodiment, a phase of the integrator clock signal $clk_{int}$ may be advantageously aligned with some delay referred to the clock signal $clk_{DEM}$ of the voltage generating circuit 200.

The clocked sample-and-hold circuit or track-and-hold circuit 20 is configured to sample or track the integrator output signal IOS with a clock frequency of a sample-and-hold clock signal or track-and-hold clock signal $clk_{S\&H}$ applied to the clocked sample-and-hold circuit or track-and-hold circuit 20 such that the integrator output signal IOS is sampled or tracked at most once per signal cycle of the input signal $V_{in}$, as illustrated in FIG. 2B. Thus, the sample-and-hold circuit or track-and-hold circuit 20 obtains a single sample or track of the integrator output for each integer multiple of a full signal cycle of the input signal, for example a full DEM period, and thus will not contain any mismatch shaping errors, thus reflecting the true DC signal only.

The feedback loop will adjust the integrator DC output signal to resemble the average, i.e. the DC level component, of the input signal $V_{in}$. As the integrator circuit 10 operates on the difference signal $DS=V_{in}-V_{out}$, it basically only processes the static error, which is driven to zero due to the infinite DC gain in the integrator circuit 10.

The proposed approach of the electric filtering circuitry 100 allows filtering of low frequency ripple which, for example, may be caused by dynamic element matching without relying on external components while guaranteeing fast startup. The filtering circuitry removes ripple transparency from input to output by sampling with an integer number of a full signal cycle of the input signal $V_{in}$, for example a full DEM cycle period, wherein sensitivity to the sampling phase in an arbitrary ripple waveform is eliminated by a closed loop topology as depicted in FIGS. 1 and 2A.

The clocked sample-and-hold circuit or track-and-hold circuit 20 enables a down-sampling of the integrator output signal so that the sample-and-hold circuit or track-and-hold circuit 20 always samples or tracks the same value. The integrator circuit 10 ensures correction of a wrong value sampled by the sample-and-hold circuit or track-and-hold circuit 20, i.e. independent where the sample-and-hold circuit/track-and-hold circuit 20 samples/tracks on the ripple curve. The sample-and-hold circuit/track-and-hold circuit 20 ensures that the ripple is not transparent at the output.

In practice, the integrator gain of the integrator circuit 10 will be limited by the open loop gain of its active components which can be designed extremely high at DC, leaving negligible static error while perfectly masking the ripple at the output side of the sample-and-hold circuit or track-and-hold circuit 20. As a significant advantage of this topology, no exact alignment of both integrator and sample-and-hold/track-and-hold clock phases is required with respect to the clock signal of the voltage generating circuit 200, for example the system DEM clock. The only requirement is that the clock period of the sample-and-hold/track-and-hold clock signal $clk_{S\&H}$ must be an integer multiple of the full signal cycle of the input signal, for example the full DEM cycle, which is easily realized.

Thus, according to a possible embodiment, the clocked sample-and-hold circuit or track-and-hold circuit 20 is configured to sample or track the integrator output signal IOS with a frequency that is lower than a frequency at which the clocked integrator circuit 10 samples and integrates the difference signal DS, as illustrated for the integrator clock signal $clk_{int}$ and the sample-and-hold/track-and-hold clock signal $clk_{S\&H}$ in FIG. 2B. Hence, the proposed topology of electric filtering circuitry 100 can achieve maximum DC accuracy without the requirement of large passive filter components. Due to the absence of large RC time constant, it can support fast startup even for low ripple/DEM frequencies.

For low ripple/DEM frequencies, the hold time of the clocked sample-and-hold circuit or track-and-hold circuit 20 can be long, resulting in droop in the hold voltage due to discharge of a hold capacitor of the clocked sample-and-hold circuit/track-and-hold circuit 20 by leakage paths. This droop can result in a non-negligible ripple if the hold capacitor size is small. In order to enable small hold capacitor size for minimum chip area, an attenuator circuit 40 can be placed following the sample-and-hold circuit/track-and-hold circuit 20, as shown in the embodiment of the electric filtering circuitry 100 of FIG. 3.

Figure 3:
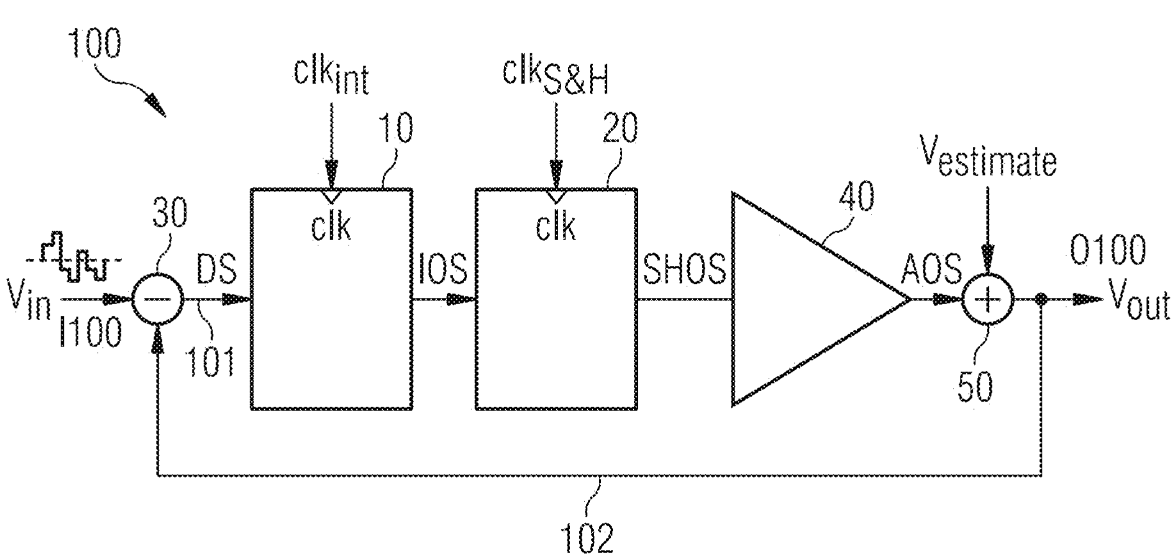
FIG. 3 shows a second embodiment of the electric filtering circuitry for filtering ripples of an input signal with an in-loop attenuator and output range adjustment for low droop.

Referring to the embodiment of the electric filtering circuitry 100 shown in FIG. 3, attenuator circuit 40 has an input side to receive the sample-and-hold/track-and-hold output signal SHOS, and an output side to provide an attenuator output signal AOS. The output side of the attenuator circuit 40 is coupled to the output terminal O100. The attenuator circuit 40 is configured to attenuate a droop of a level of the sample-and-hold/track-and-hold output signal SHOS.

The attenuator circuit 40 following the clocked sample-and-hold circuit/track-and-hold circuit 20 in the forward path 101 enables any droop and related ripple to be attenuated at the output signal $V_{out}$. However, the required DC integrator swing would be increased by the same attenuation factor, making this impractical in the presence of large DC input signals.

According to an embodiment of the electric filtering circuitry 100 shown in FIG. 3, a summing node 50 is arranged in the forward path 101 to receive the sample-and-hold or track-and-hold output signal SHOS and an estimation signal $V_{estimate}$. The estimation signal $V_{estimate}$ represents an estimation of the input signal $V_{in}$. The summing node 50 provides the output signal $V_{out}$ as a representation of a sum of the sample-and-hold/track-and-hold output signal SHOS and the estimation signal $V_{estimate}$.

Adding an estimation of the input signal provided by estimation signal $V_{estimate}$ to the output enables saturation of the integrator output for large DC signals to be prevented, so that it will not need to be provided by the integrator output anymore. The integrator circuit 10 will thus only settle to the difference $V_{in}-V_{estimate}$, allowing for much higher possible attenuation factors for a given integrator output swing.

Figure 4:
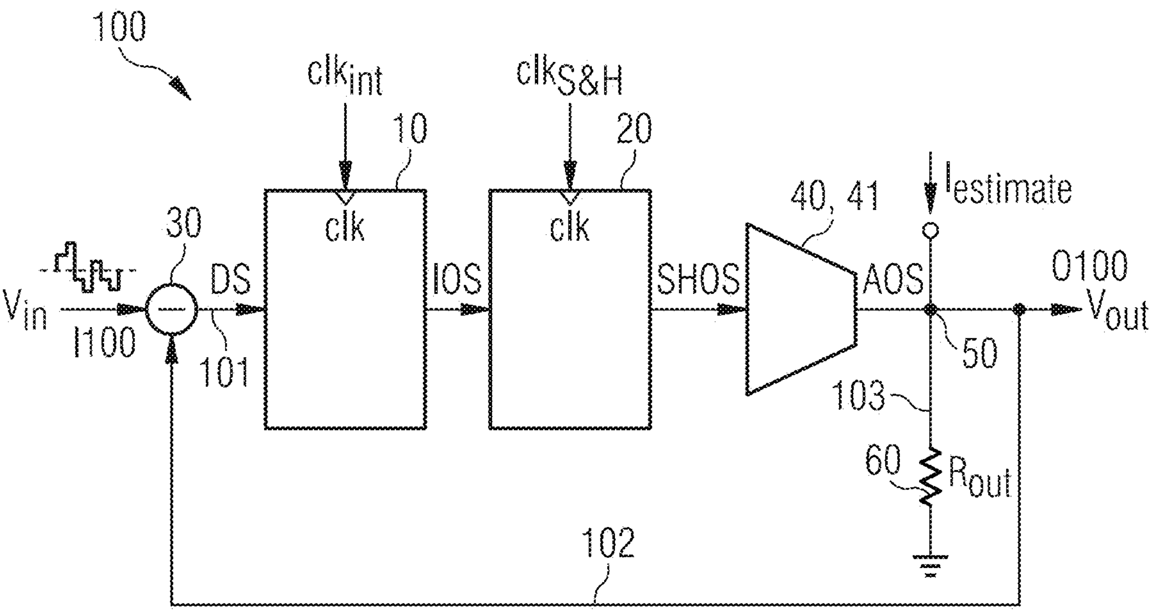
FIG. 4 shows a third embodiment of an electric filtering circuitry for filtering ripples of an input signal with in-loop attenuator and output signal addition in the current domain.

The estimation signal $V_{estimate}$ for integrator output range adaption can be added in the voltage or current domain. Referring to FIG. 4, to enable current domain addition, the attenuator circuit 40 may comprise a transconductor circuit 41 arranged between the output side of the sample-and-hold circuit/track-and-hold circuit 20 and summing node 50. At least one resistor 60 is arranged in a resistive current path 103 between summing node 50 and a reference potential. Current domain addition allows an efficient implementation using transconductor circuit 41 with load resistor 60, as shown for the embodiment of the electric filtering circuitry 100 in FIG. 4. The estimation signal is then added as a current given by $V_{estimate}/R_{out}$, wherein $R_{out}$ is the resistance of load resistor 60.

Figure 5:
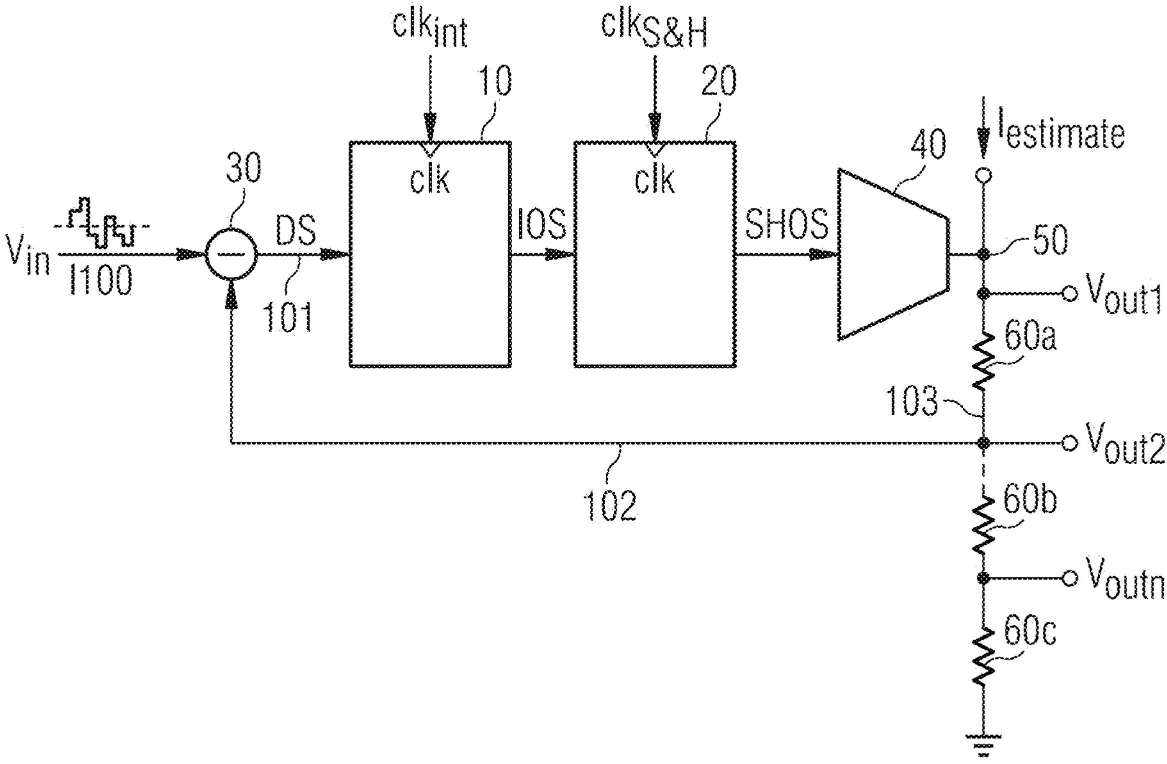
FIG. 5 shows a fourth embodiment of an electric filtering circuitry for filtering ripples of an input signal with multiple output taps.

Referring to another embodiment of the electric filtering circuitry 100 shown in FIG. 5, a plurality of resistors 60*a*, 60*b*, 60*c* may be arranged in series in the resistive current path 103. The feedback path 102 is coupled to a tap of the resistive path 103 between two of the resistors 60*a*, 60*b*, 60*c*. The current-to-voltage conversion in the current domain implementation shown in FIG. 5 allows ratio metric output taps to be implemented which are defined by resistor ratios of resistors 60*a*, 60*b*, 60*c*. As a result, several output/reference voltages Vout1, Vout2, . . . , Voutn can be derived from a single input reference at $V_{in}$.

In order to minimize an integrator DC output swing for a maximum possible attenuation, estimation signal $V_{estimate}$ should resemble input signal $V_{in}$ as close as possible. In practice, this is challenging due to PVT variations in estimation signal $V_{estimate}$ when generated on-chip. For example, it could be derived from a constant gm current source which typically experiences +−20% process variation. This variation must be accounted for by reducing the amount of attenuation in order to prevent saturation of the integrator circuit 10 under all conditions.

Figure 6:
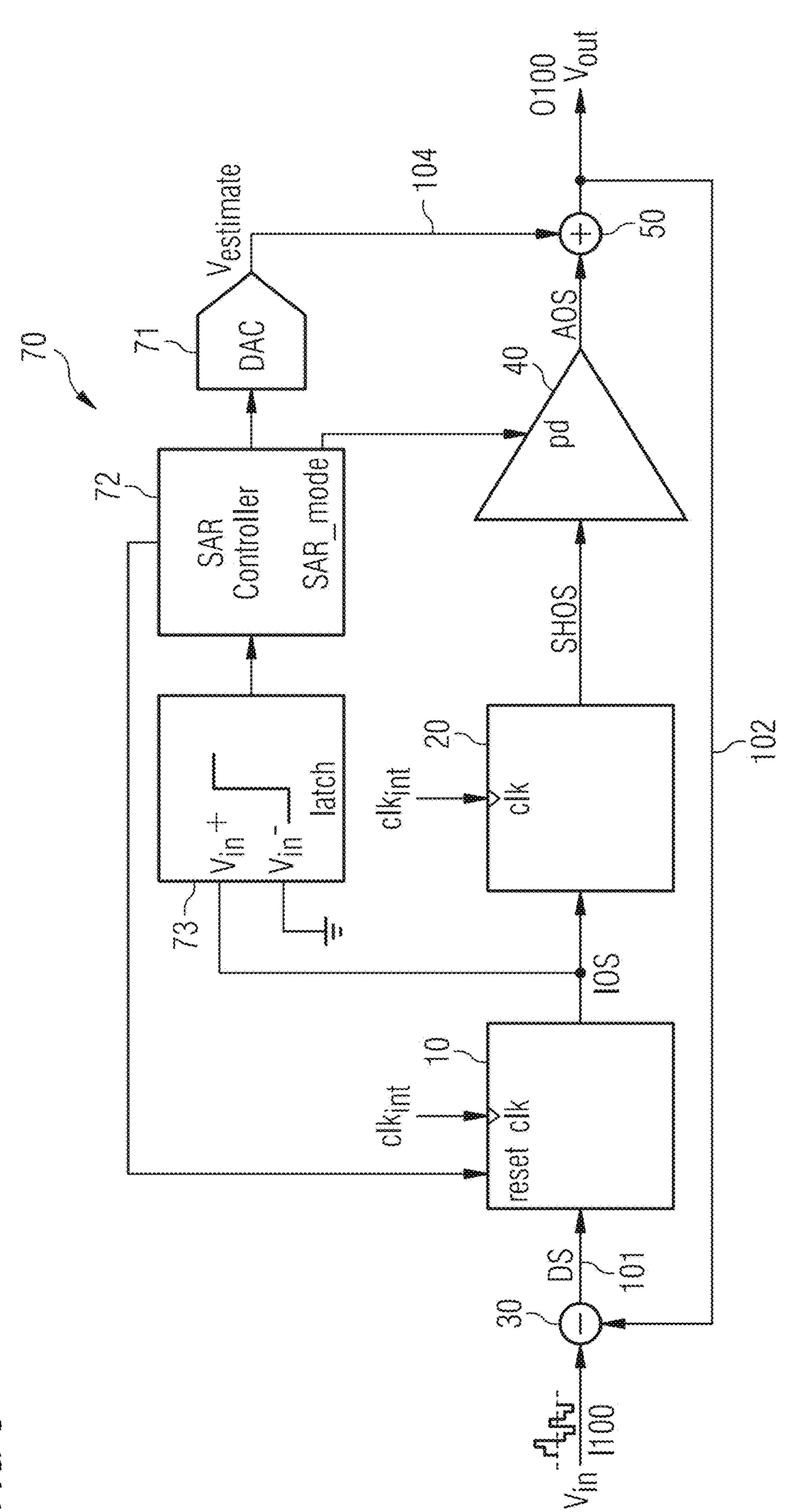
FIG. 6 shows a fifth embodiment of an electric filtering circuitry for filtering ripples of an input signal with successive approximation register assisted output range adjustment.

Referring to FIG. 6, in order to minimize variation of estimation signal $V_{estimate}$, electric filtering circuitry 100 may comprise an estimation signal generation circuit 70 being configured to provide estimation signal $V_{estimate}$ by SAR (Successive Approximation Register) assisted output range adjustment. The estimation signal generation circuit 70 may comprise a digital-to-analog converter 71, a successive approximation register control circuit 72 and a latch circuit 73. Digital-to-analog converter 71, successive approximation register control circuit 72 and latch circuit 73 are arranged in a feedback path 104 of the filtering circuitry 100 between the output side of the clocked integrator circuit 10 and the summing node 50.

The configuration of the estimation signal generation circuit 70 shown in FIG. 6 enables variation of estimation signal $V_{estimate}$ to be minimized by digital-to-analog converter 71 which is adjusted in a SAR loop, as depicted in FIG. 6. During SAR operation, the forward path 101 from the output side of integrator circuit 10 to output terminal O100 is shut off by deactivating attenuator circuit 40 or by a switch arranged in the forward path 101, and the digital-to-analog converter output is initially set to its mid-range. The integrator circuit 10 is then reset followed by an integration period of one or more signal cycles, for example DEM cycles, of input signal $V_{in}$.

After integration the difference between input signal $V_{in}$ and estimation signal $V_{estimate}$ is sufficiently amplified to detect its sign by latch circuit 73, and the process can be continued with a next SAR cycle. Any ripple in input signal $V_{in}$ will not affect comparison accuracy as it is filtered by the full cycle integration of the input signal, for example full DEM cycle integration. After the last SAR step, estimation signal $V_{estimate}$ is within +−0.5 LSB of the DC value of input signal $V_{in}$. As a result, optimum attenuation can be achieved over a wide range of process and temperature variations in the consecutive ripple filter operation.

During ripple filter operation the loop is closed by activating forward/attenuation path 101 again. The loop will adjust integrator output signal IOS to provide the difference between input signal $V_{in}$ and estimation signal $V_{estimate}$ ($V_{in}-V_{estimate}$) at the output side of attenuator circuit 40 so that input signal $V_{in}$ and output signal $V_{out}$ are matched precisely.

Figure 7:
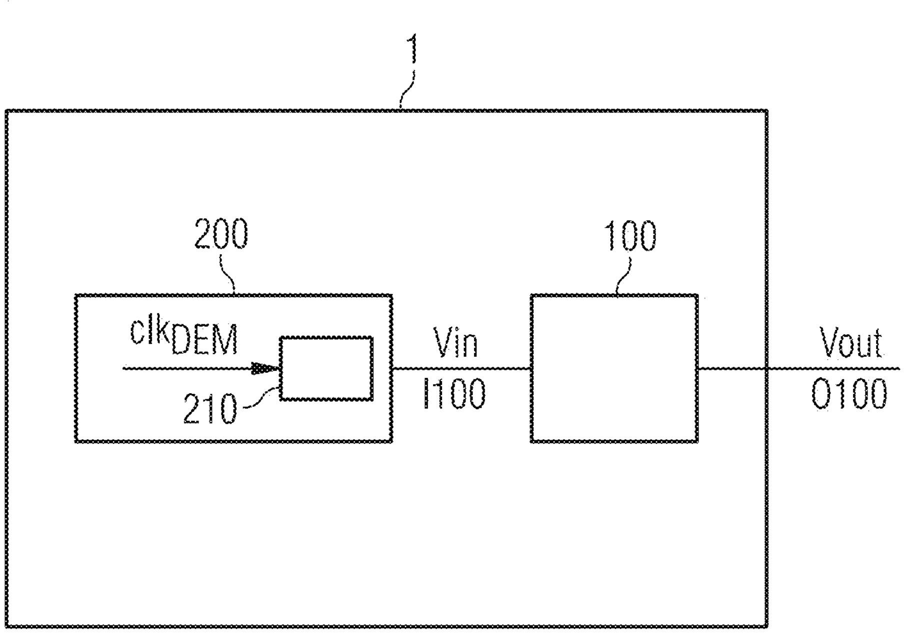
FIG. 7 shows an embodiment of a voltage generation circuitry to provide a ripple-free copy of an input signal of an electric filtering circuitry at an output of the filtering circuitry.

FIG. 7 shows a possible application of the electric filtering circuitry 100 as a component of a voltage generation circuitry 1. Voltage generation circuitry 1 may be configured as a reference generation circuit. Voltage generation circuitry 1 comprises voltage generating circuit 200 to provide the input signal $V_{in}$ at the input terminal of electric filtering circuitry 100.

Voltage generating circuit 200 may comprise circuit 210 for providing chopping or dynamic element matching operations being controlled by clock signal $clk_{DEM}$, as explained above with reference to FIG. 2A. Voltage generating circuit 200 may be configured as a precision bandgap reference circuit which provides a temperature stable voltage reference with chopping or DEM ripple superimposed on a mid-value of input signal $V_{in}$.

The electric filtering circuitry 100 may be embodied as a ripple filtering circuit according to any of the embodiments described with reference to FIGS. 1A to 6. Any of the embodiments of ripple filtering circuitry 100 described above can then be cascaded to provide a ripple-free copy of input signal $V_{in}$, for example a bandgap reference voltage at the output terminal O100.

Electric filtering circuitry 100 allows a robust ripple filter to be built with high ripple suppression, best DC accuracy, fast startup and without using off-chip components. The electric filtering circuitry 100 may be provided as a component in any low area precision circuit, for example for photon counting or consumer sensor applications.

The embodiments of the electric filtering circuitry and the voltage generation circuitry disclosed herein have been discussed for the purpose of familiarizing the reader with novel aspects of the design of the electric filtering circuitry and the voltage generation circuitry. Although preferred embodiments have been shown and described, many changes, modifications, equivalents and substitutions of the disclosed concepts may be made by one having skill in the art without unnecessarily departing from the scope of the claims.

In particular, the design of the electric filtering circuitry and the voltage generation circuitry are not limited to the disclosed embodiments, and gives examples of many alternatives as possible for the features included in the embodiments discussed. However, it is intended that any modifications, equivalents and substitutions of the disclosed concepts be included within the scope of the claims which are appended hereto.

Features recited in separate dependent claims may be advantageously combined. Moreover, reference signs used in the claims are not limited to be construed as limiting the scope of the claims.

Furthermore, as used herein, the term "comprising" does not exclude other elements. In addition, as used herein, the article "a" is intended to include one or more than one component or element, and is not limited to be construed as meaning only one.

REFERENCES

1 voltage generation circuitry
10 integrator circuit
20 sample-and-hold circuit/track-and-hold circuit
30 summing node
40 attenuator circuit
41 transconductor circuit
50 summing node
60 load resistor
70 estimation signal generation circuit

71 digital-to-analog converter
72 SAR control circuit
73 latch circuit
101 forward path
102 feedback path
103 resistive current path
104 feedback path
$V_{in}$ input signal
$V_{out}$ output signal
$V_{estimate}$ estimation signal
DS difference signal
IOS integrator output signal
SHOS sample-and-hold/track-and-hold output signal
AOS attenuator output signal
$clk_{DEM}$, $clk_{int}$, $clk_{S\&H}$ clock signal

The invention claimed is:

1. An electric filtering circuitry for filtering ripples of an input signal, comprising:

an input terminal for applying the input signal, an output terminal to provide an output signal, a forward path including a clocked integrator circuit and a clocked sample-and-hold or track-and-hold circuit, a summing node being arranged to receive the input signal and the output signal, and to provide a difference signal being a representation of a difference between the input signal and the output signal, wherein the clocked integrator circuit has an input side being connected to the summing node to receive the difference signal, and an output side to provide an integrator output signal, wherein the clocked sample-and-hold or track-and-hold circuit has an input side to only receive the integrator output signal, and an output side to provide a sample-and-hold or track-and-hold output signal, the output side of the sample-and-hold or track-and-hold circuit being coupled to the output terminal, wherein a feedback path is arranged between the output terminal and the summing node, and wherein the clocked integrator circuit is configured to perform a discrete time integration by sampling and integrating the difference signal with a clock frequency of an integrator clock signal applied to the clocked integrator circuit.

2. The electric filtering circuitry of claim 1, wherein the clocked integrator circuit is configured to sample and integrate the difference signal so that samples of the difference signal are integrated, and the integrator output signal is provided as a representation of the integrated samples of the difference signal.

3. The electric filtering circuitry of claim 1, wherein the clocked sample-and-hold or track-and-hold circuit is configured to sample or track the integrator output signal and to provide the sample-and-hold or track-and-hold output signal as a representation of the sampled integrator output signal.

4. The electric filtering circuitry of claim 1, wherein the clocked sample-and-hold or track-and-hold circuit is configured to sample or track the integrator output signal with a frequency being lower than a frequency at which the clocked integrator circuit samples and integrates the difference signal.

5. The electric filtering circuitry of claim 1, comprising:

an attenuator circuit having an input side to receive the sample-and-hold or track-and-hold output signal, and an output side to provide an attenuator output signal, the output side of the attenuator circuit being coupled to the output terminal, wherein attenuator circuit is configured to attenuate a droop of a level of the sample-and-hold or track-and-hold output signal.

6. The electric filtering circuitry of claim 5, comprising:

a second summing node being arranged in the forward path to receive the sample-and-hold or track-and-hold output signal and an estimation signal representing an estimation of the input signal, and to provide the output signal being a representation of a sum of the sample-and-hold or track-and-hold output signal and the estimation signal.

7. The electric filtering circuitry of claim 6, wherein the attenuator circuit comprises a transconductor circuit being arranged between the output side of the sample-and-hold or track-and-hold circuit and the second summing node, wherein at least one resistor is arranged in a resistive current path between the second summing node and a reference potential.

8. The electric filtering circuitry of claim 7, wherein the at least one resistor comprises a plurality of resistors being arranged in series in the resistive current path, wherein the feedback path is coupled to a tap of the resistive path between the resistors of the resistive current path.

9. The electric filtering circuitry of claim 1, comprising:

an estimation signal generation circuit being configured to provide an estimation signal by successive approximation register assisted output range adjustment.

10. The electric filtering circuitry of claim 9, wherein the estimation signal generation circuit comprises a digital-to-analog converter, a successive approximation register control circuit and a latch circuit being arranged in a second feedback path between the output side of the clocked integrator circuit and the second summing node.

11. A voltage generation circuitry, comprising:

an electric filtering circuitry for filtering ripples of an input signal according to claim 1, a voltage generating circuit to provide the input signal for the electric filtering circuitry, wherein the voltage generating circuit is embodied to provide the input signal with periodically repeating signal cycles, the input signal having a DC component being superimposed with an AC component, the AC component forming the ripple of the input signal.

12. The voltage generation circuitry of claim 11, wherein the voltage generating circuit is configured to provide each signal cycle of the input signal with a plurality of pulses clocked with a clock frequency of a clock signal of the voltage generating circuit, each pulse forming the AC component of the input signal, wherein the integrator clock signal has the same clock frequency as the clock signal of the voltage generating circuit.

13. The voltage generation circuitry of claim 12, wherein a phase of the integrator clock signal is aligned with some delay referred to the clock signal of the voltage generating circuit.

14. The voltage generation circuitry of claim 13, wherein the clocked sample-and-hold or track-and-hold circuit is configured to sample or track the integrator output signal with a clock frequency of a sample-and-hold or track-and-hold clock signal applied to the clocked sample-and-hold or track-and-hold circuit such that the integrator output signal is sampled at most once per signal cycle of the input signal.

15. The voltage generation circuitry of claim 11, wherein the voltage generating circuit comprises a circuit for providing chopping or dynamic element matching operations, the chopping or dynamic element matching operations being controlled by the clock signal of the voltage generating circuit.

* * * * *